United States Patent [19]
Ehrlich

[11] Patent Number: 5,310,624
[45] Date of Patent: May 10, 1994

[54] INTEGRATED CIRCUIT MICRO-FABRICATION USING DRY LITHOGRAPHIC PROCESSES

[75] Inventor: Daniel J. Ehrlich, Lexington, Mass.

[73] Assignee: Massachusetts Institute of Technology, Cambridge, Mass.

[21] Appl. No.: 924,374

[22] Filed: Jul. 31, 1992

Related U.S. Application Data

[63] Continuation of Ser. No. 517,394, Apr. 27, 1990, abandoned, which is a continuation of Ser. No. 149,426, Jan. 29, 1988, abandoned.

[51] Int. Cl.$^5$ ............................................. G03C 5/00
[52] U.S. Cl. .................................. 430/322; 430/297; 430/311; 430/945
[58] Field of Search ............... 430/297, 311, 945, 322; 427/450, 452, 455, 322

[56] References Cited

U.S. PATENT DOCUMENTS

| | | | |
|---|---|---|---|
| Re. 32,033 | 11/1985 | Moreland et al. | 430/311 |
| 3,959,105 | 6/1976 | Feneberg et al. | 204/165 |
| 4,170,662 | 10/1979 | Weiss et al. | 427/38 |
| 4,178,097 | 12/1979 | Sara | 355/110 |
| 4,179,312 | 12/1979 | Keller et al. | 148/1.5 |
| 4,260,649 | 4/1981 | Dension et al. | 427/53.1 |
| 4,283,482 | 8/1981 | Hattori et al. | 430/296 |
| 4,340,617 | 7/1982 | Deutsch et al. | 427/53.1 |
| 4,348,473 | 9/1982 | Okumura et al. | 430/296 |
| 4,359,485 | 11/1982 | Donnelly et al. | 427/53.1 |
| 4,444,456 | 4/1984 | Jain et al. | 350/3.7 |
| 4,458,994 | 7/1984 | Jain et al. | 354/4 |
| 4,490,211 | 12/1984 | Chen et al. | 156/643 |
| 4,516,832 | 5/1985 | Jain et al. | 350/96 |
| 4,521,087 | 6/1985 | Hayes et al. | 350/574 |
| 4,549,064 | 10/1985 | Delfino | 219/121 |
| 4,560,641 | 12/1985 | Kokaku et al. | 430/312 |
| 4,568,632 | 2/1986 | Blum et al. | 430/322 |
| 4,608,117 | 8/1986 | Ehrlich et al. | 156/610 |
| 4,615,904 | 10/1986 | Ehrlich et al. | 427/38 |
| 4,619,894 | 10/1986 | Bozler et al. | 430/942 |
| 4,622,095 | 11/1986 | Grobman et al. | 156/635 |
| 4,626,449 | 12/1986 | Hirai et al. | 427/53.1 |
| 4,653,903 | 3/1987 | Torigoe et al. | 355/53 |
| 4,698,238 | 10/1987 | Hayasaka et al. | 427/53.1 |

FOREIGN PATENT DOCUMENTS

| | | |
|---|---|---|
| 0066053 | 8/1982 | European Pat. Off. . |
| 0111655 | 3/1984 | European Pat. Off. . |
| 0178654 | 4/1985 | European Pat. Off. . |
| 2153543A | 8/1985 | United Kingdom . |

OTHER PUBLICATIONS

Cali et al., (1976), Applied Optics, vol. 15, No. 5:1327-1330.
Ehrlich et al., (1981), Appl. Phys. Lett. 38(11), vol. 38, No. 11:946-948.
Deutsch et al., (1979), Appl. Phys. Lett. 35(2) vol. 35, No. 2:175-177.
Hanabusa et al., (1979), Appl. Phys. Lett. 35(8), vol. 35, No. 8:626-627.
Andreatta et al., (1982), J. Vac. Sci. Technol, 20(3), 740-742.
Ehrlich et al, (1985), J. Vac. Sci. Technol, vol. B 3(1), No. 1, pp. 1-8.
Beatty, "Thin Films" in Handbook of Materials, Harper, ed., McGraw-Hill, Inc., 1970, pp. (11-1)-(11-19).
Dr. Rothschild et al., "Attainment of 0.13 micron lines . . .", J. Vac. Sci. Technology vol. B(5) (1), pp. 389-390 (1987).
Rothschild, et al., "Excimer-laser etching of diamond and hard carbon films by direct writing and optical projection", vol. B4, No. 1, J. Vac. Sci. Technol., pp. 310-314 (1986).

Primary Examiner—Thori Chea
Attorney, Agent, or Firm—Thomas J. Engellenner; John V. Bianco

[57]

Dry, laser-based, lithographic techniques and systems for patterning a surface of a wafer or other substrate are disclosed. The techniques and systems are particularly adapted for automated micro-fabrication of integrated circuits on semiconductor wafers. The invention entails dry depositing a resist material on a surface of a substrate, then generating a pattern in the resist material by selectively exposing the resist material to pulsed UV laser radiation, controlling the ambient exposure of the resist material between the resist-depositing and pattern-generating steps, and, finally, transferring the pattern from the resist to the substrate or otherwise employing the pattern to transform the substrate by deposition or implantation of materials.

3 Claims, 4 Drawing Sheets

INTEGRATED CIRCUIT MICRO-FABRICATION USING DRY LITHOGRAPHIC PROCESSES

The United States Government has rights in this invention pursuant to the Department of Air Force Contract No. F19628-85-C-0002.

This application is a continuation of application Ser. No. 07/514,394, filed Apr. 27, 1990, now abandoned which is a continuation of application Ser. No. 07/149,426, filed Jan. 29, 1988, now abandoned.

BACKGROUND OF THE INVENTION

This invention generally relates to micro-fabrication of integrated circuits and, particularly, to an improved process and apparatus for pattern formation on semiconductor wafers to form such circuits.

Within the semiconductor industry, production of electronic circuits by very large scale integration ("VLSI") techniques is constrained by a variety of factors which limit yield and inhibit process flexibility. These detrimental factors include, for example, the exposure of wafers to contaminants and/or oxidation during fabrication. Such processing constraints adversely affect mass production of integrated circuits. In addition, conventional processes are slow and inordinately expensive for the fabrication of low-volume products, thus posing an impediment to new device and circuit designs.

Processes for micro-texturing and patterning semiconductor wafers typically rely on lithographic transfer of the desired image from a thin-film of radiation-sensitive resist material. The process entails the formation of a sacrificial layer, the "resist", which is photo-lithographically patterned.

The patterning of the resist involves several steps, including exposing the resist to a selected light source through a suitable mask to record a latent image of the mask and then developing and removing selected regions of the resist. For a "positive" resist, the exposed regions are removed; while for a "negative" resist, the unexposed regions are removed.

For example, in conventional processes using a deposited polymeric resist, the film is exposed with visible or near UV light, electrons or x-rays to induce chain sission (in the case of a positive resist) or cross-linking (in a negative resist) of the polymeric resist material, followed by development in an organic solvent. The pattern can be transferred into surface texture in the wafer by etching with a reactive gas using the patterned resist as a protective masking layer. Alternatively, when a wafer is "masked" by the resist pattern, it can be processed to form active electronic devices and circuits by depositing conductive or semiconductive materials or implanting dopants into etched wells and other surface structures.

Conventional micro-fabrication processes require a number of wet processing steps. For example, there is a general trend towards the use of organic polymer materials as resists, such as Novolack resins, polyesters, or polyimides. These materials are typically spun cast onto the wafer as a thin film (e.g., about 0.1 to 3.0 microns thick) from a wet polymeric solution, such as monoethyl ether or chlorobenzene. In addition, the development steps (in which regions of the resist are removed) typically involve treating the exposed film with another liquid solvent.

The use of conventional wet deposition and developing solutions is a major source of contamination and, consequently, defects in the fabrication of integrated circuits because such wet processing steps typically involve breaks in vacuum or controlled-ambient conditions. Whenever this occurs, the surfaces of the wafer can begin to oxidize in the air or become exposed to airborne chemical and particulate contamination. As a result, the wafer surfaces often must be cleaned and dried before the next processing step can commence. The deposition, development, cleaning and drying operations typically are time-consuming and reduce the through-put of the overall fabrication process. Moreover, the liquid solvents, themselves, can also be major sources of active corrosion or chemical contamination and thereby contribute further defects to the circuit or adversely affect dimensional control.

Another major source of contamination during integrated circuit fabrication is introduced by human operators working in the manufacturing clean room. Human operators are presently required in the clean room, for example, for process set-up and monitoring and transfer of wafers between process stations. It has been estimated that an operator making only light hand and arm movements sheds approximately 6000 particles per minute of a size equal to or larger than 0.3 microns. Successful wafer fabrication can not allow even one such particle per square centimeter to accumulate on the wafer over the processing cycle which can last several weeks. At present, the problem of human contamination of wafers during processing is addressed largely by protective garments and air filtration technology.

It is an object of the invention to provide improved processes and systems for pattern formation on integrated circuit wafers.

It is a further object of the invention to provide simpler processes and systems for patterning such wafers while exposing the wafers to a reduced level of contaminants and while limiting the interaction of humans during processing.

It is yet another object of the invention to provide more flexible, economic and automated processes and systems for patterning wafers with high resolution.

SUMMARY OF THE INVENTION

The invention encompasses dry, laser-based, lithographic exposure/development techniques and systems for patterning a surface of a wafer or other substrate. All-dry patterning processes are disclosed which avoid exposure of the substrate to liquid solvents and/or air, as well as reduce (or eliminate) human operators as a source of contaminants.

The invention entails dry depositing a resist material on a surface of a substrate, then generating a pattern in the resist material by selectively exposing the resist material to pulsed UV laser radiation, controlling the ambient exposure of the resist material between the resist-depositing and pattern-generating steps, and, finally, transferring the pattern from the resist to the surface of the substrate or otherwise employing the pattern to transform the substrate by deposition or implantation of materials.

Preferably the above-described steps are accomplished in a single-enclosure, automated, integrated-circuit micro-fabricating apparatus having a plurality of processing stations or modules through which wafers are transported during processing and along which the wafers remain in a controlled ambient. For processing, the wafers are introduced preferably on a continuous-feed basis into a main trunk or bus through an entry/exit port constituting an air lock or vapor seal. The wafers are carried by a transport to one of many processing lines connected to the main bus to receive the wafers. The wafers enter the processing line through another air lock arrangement, utilizing, for example, a "smart" gate valve. The processing line preferably includes a series of chambers interlocked in airtight fashion to receive the wafers carried by the transport. The chambers constitute modules or stations in which wafers are processed. For example, a first chamber serves as a holding station for wafer queuing. In a second one, a resist material is applied by a dry deposition technique. The term "dry" as used herein is meant to denote the absence on exposure to, or use of, liquid solutions or solvents. In a third chamber, the resist is exposed to pulsed laser radiation, preferably from an excimer laser. The radiation exposure creates either a physical or latent pattern in the resist. A physical pattern is one which entails a macro-structural change in the topography or morphology of the resist. Where the exposure produces a physical pattern, it can be referred to as a self-developing resist process. A latent pattern is one which entails micro-structural or chemical modification of regions of the resist. Subsequent processing of the wafer in yet another chamber can develop the latent pattern into a physical one.

Once the resist is patterned in the aforedescribed processing line, the wafer can be returned by the transport to the main bus where it is routed to other processing line in automated fashion pursuant to a predetermined program and as directed by a controller.

In a second processing line, for example, the resist pattern can be used to create a surface relief pattern on the wafer by dry etching or the like. Then the remaining resist is removed at a stripping station.

Still other processing lines have stations for deposition, ion implantation, cleaning, etc. These other processes are well known, and, in and of themselves, are not part of the present invention. However, importantly, these other processes can be Performed within the single-enclosure, controlled-ambient of the micro-fabrication apparatus described herein.

The invention embraces both the aforedescribed process and apparatus for lithographically forming patterns in wafers and other substrates, as well as devices made thereby. The technique allows the elimination of exposure to air, liquid solutions and solvents, and invasive human presence during Processing with a resulting reduction in contamination and, consequently, defect density in the wafer. Elimination of wet solutions and solvents also reduces the number of processing steps by rendering unnecessary such conventional processing steps as wet resist deposition, wet development, pre-baking, and post-baking. Since the technique is automated, improved flexibility is achieved. Furthermore, with the use of U.V. lasers during the exposure step, high-resolution and improved through-put can be achieved. With self-developing resists, a significant reduction is realizable in the number of wafer-handling steps otherwise performed for resist development. The technique offers improved effective yield and, with in situ monitoring, improved quality control, while simplifying and reducing the cost of micro-fabricating integrated circuits.

BRIEF DESCRIPTION OF THE DRAWINGS

For a fuller understanding of the features, advantages and objects of the invention, reference should be made to the following detailed description and the accompanying drawings, in which.

DETAILED DESCRIPTION

The invention shall now be described with reference to the drawings in which like reference numbers designate similar features.

Figure 1:
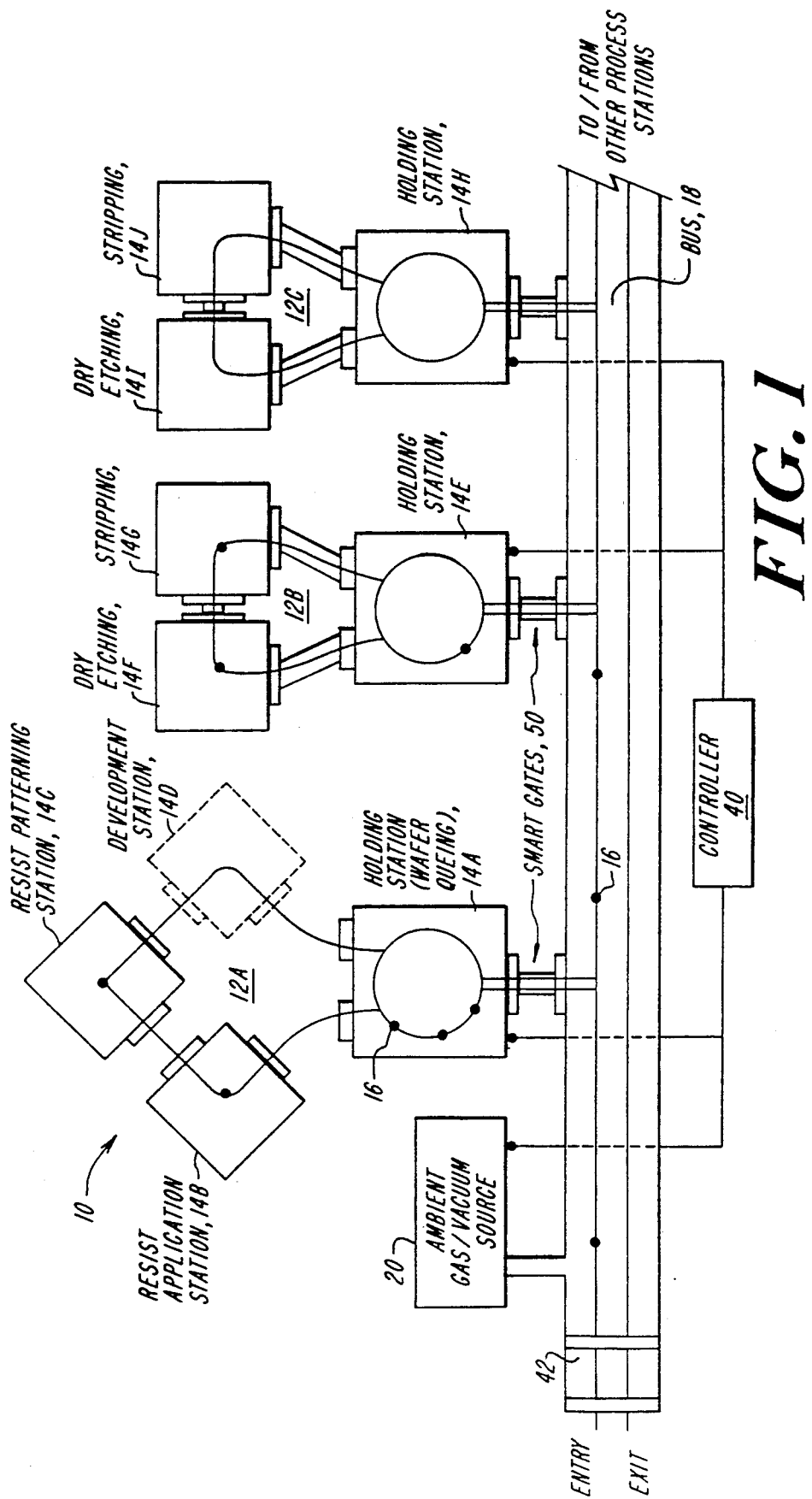
FIG. 1 is a partial schematic representation of an integrated circuit, micro-fabricating machine showing photo-lithographic resist processing modules or stations in accordance with the invention.

FIG. 1 illustrates diagramatically a photolithographic system for use in the micro-fabrication of integrated circuits, and particularly in forming a pattern on a surface of a wafer or other substrate. In accordance with the present invention, FIG. 1 illustrates a single-enclosure, automated, integrated circuit micro-fabricating apparatus 10 having a plurality of processing lines 12A, 12B, 12C operationally interconnected by a main trunk or bus 18. Each of the processing lines 12A, 12B and 12C includes at least one module or station at which one or more processing steps is carried out. The modules are generally designated by the numeral 14, followed by a letter to distinguish one from another. The illustrated apparatus 10 is but one exemplary configuration for such a machine; other practical configurations will be apparent from the following description to one skilled in the art.

The atmosphere within the main bus 18 is regulated by means of a gas source 20. In one preferred embodiment, the gas source 20 can operate to achieve a vacuum of $10^{-8}$ to $10^{-10}$ for gallium arsenide or $10^{-5}$ to $10^{-7}$ Torr for silicon, or an inert gas with a water-free vapor such as nitrogen or argon at 100 to 1000 Torr.

A transport 30 such as a track system or conveyor-belt arrangement extends along the main bus 18 in a loop fashion and branches into each of the processing lines, again in loop fashion. The transport is adapted to carry the wafers 16 at predetermined positions spaced from one another as directed by a controller 40.

For processing, the wafers are introduced preferably on a continuous-feed basis into the main bus 18 through an entry/exit port 42 constituting a air lock or vapor seal such as a lip-seal arrangement. Once within the apparatus 10, the wafers are carried by the transport 30 to one or more processing lines 12A, 12B, 12C in succession or in any order programmed by the controller 40. Additionally, the controller 40 can direct transport 30 to carry specified wafers to or from other Processing stations not shown in FIG. 1, such as for deposition, for implantation, for cleaning, etc.

The illustrated processing lines 12A, 12B and 12C are used in photo-lithographically patterning the wafer. Each of the modules 14A through 14J inclusive includes an airtight chamber having at least one entry/exit port in the form of an air lock arrangement 50, utilizing, for example, a "smart" gate valve. The "smart" gate can incorporate appropriate sensors and markers for keeping track of wafers during processing. For example, bar codes or the like can be printed on the wafers and read by a detector at the "smart" gate to determine which wafers require processing at the module to which the gate is attached. In the illustrated apparatus 10, wafers can be directed to and from any of the modules 14A through 14J in any of the processing lines 12A, 12B, 12C, passing by or through any intervening modules interposed between the main bus 18 and the desired module.

The illustrated resist preparation line 12A includes several processing stations: The wafer queuing station 14A is a holding station in which the transport 30 maintains the wafers on an endless or decoupled loop or other known arrangement until further processing is timely. The resist application module 14B applies the resist to the wafer. The resist exposure module 14C laser patterns the resist. The optional resist developer module 14D converts latent patterns to physical patterns when the resist exposure module 14C generates the former.

Figure 2:
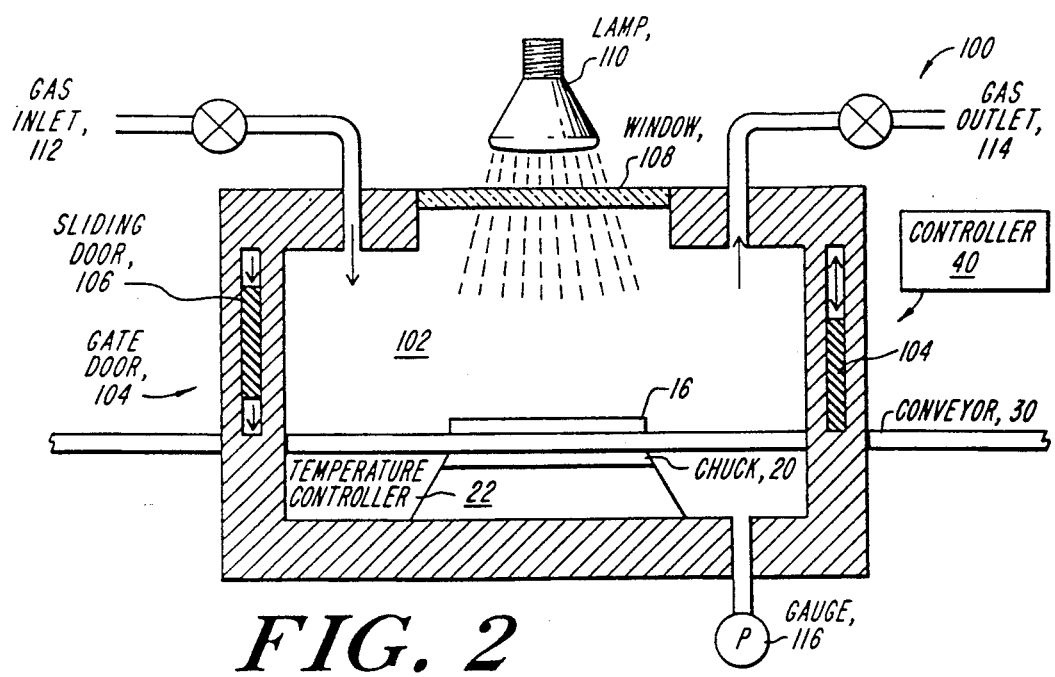
FIG. 2 is a schematic representation of one embodiment of the photo-lithographic resist application module of FIG. 1.

FIG. 2 is a more detailed, schematic representation of a resist application module such as module 14B of FIG. 1 showing an exemplary embodiment—that of a thermal/photo chemical vapor deposition ("CVD") apparatus 100. CVD apparatus 100 is used to deposit resist film from reactive vapor at room temperature with or without illumination of actinic light.

As shown, CVD apparatus 100 includes a vessel or chamber 102 having at each end an entry or exit port constituting a smart gate 104. The smart gate 104 has one or more sliding doors 106 for admitting or discharging the wafer carried on transport 30, and for closing and sealing off the chamber 102 so as to render it gas tight. Along one wall of the chamber is a window 108 which is transparent to light emitted by an externally-mounted lamp source 110. The lamp source 110 is, for example, a low-pressure mercury lamp operated at room temperature. Valved gas inlet and outlet conduits 112, 114 are connected with the chamber 102 to control the atmosphere therein. A pressure monitor or gauge 116 is also provided.

One typical application of the CVD apparatus 100 is for polymethyl methacrylate (PMMA) deposition. The wafer is carried into the chamber 102 by transport 30, and positioned by chuck 20 in alignment with heat controller 22, the window 108 and lamp source 110. After purging and flushing the atmosphere with the chamber 102, methyl methacrylate vapor is introduced into the chamber 102 through inlet conduit 112 until it reaches 1 to 10 Torr pressure, followed by Cd(CH$_3$)$_2$ vapor until the pressure gauge 112 reads 0.1 to 1.0 Torr. The latter gas serves as a catalyst. Flood illumination of the wafer by the lamp source 110 (approximately (W/cm$^2$, 254-nm light) yields the PMMA deposition.

In an analogous manner CVD apparatus 100 can be used to deposit other resist materials. For example, amorphous silicon can be deposited on a heated substrate, with or without illumination when the chamber is filled with a silane or disilane gas.

The resist application module 14B need not be a CVD apparatus since other suitable deposition techniques are known in the art. Plasma deposition or electron-beam or ion-beam reactive depositions can be substituted, using known apparatus. In these techniques, a resist film is deposited from a plasma or by similar electron-beam or ion-beam-induced reaction of a vapor. Also, "remote plasma" techniques, in which plasma and vapor are mixed in downstream flow, can be substituted. Using such techniques hard carbon resists can be formed by ion-beam or RF plasma-induced decompositions of butane or hydrocarbon vapors, and amorphous silicon resists can be deposited from silane by RF plasma-induced decomposition.

Still another alternative technique is to form the resist layer by sputter deposition/ evaporation. In these techniques the physical deposition is achieved by transport of ions or molecules of the resist material from a sacrificial target. In sputtering, an electron-beam or ion-beam is directed onto the target to bombard and eject material. The resulting sputtering ions or molecules emitted from the material impinge upon the substrate or wafer, causing a film to build up. In evaporation deposition, the target is heated to evaporate molecules; the evaporant then strikes and builds up on the substrate. In one conventional practice of such methods, SiO$_2$ is sputter-deposited from a solid target or aluminum is deposited by "evaporation." In the latter practice, the wafer is placed in an evacuated vessel, an electron beam is directed toward a target of aluminum metal to heat it to its vaporization point. The aluminum vapor then condenses on the wafer.

Figure 3:
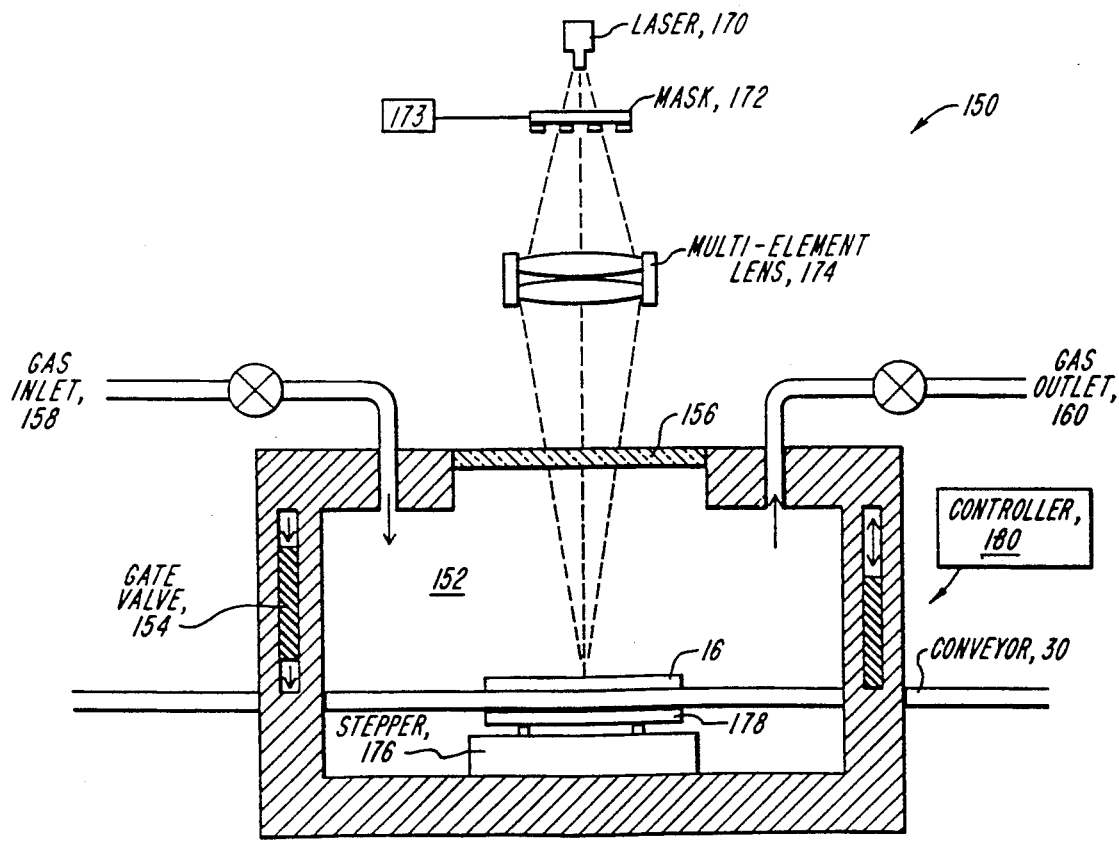
FIG. 3 is a schematic representation of one embodiment of the photo-lithographic resist exposure module of FIG. 1.

In FIG. 3, a representative embodiment of the resist exposure module 14C of FIG. 1 is illustrated. In accordance with the invention, a pulsed UV laser apparatus 150 is used. The apparatus 150 includes a vessel or chamber 152 generally similar to chamber 102 described above, having smart gates 154, window 156 and inlet and outlet valved conduits 158, 160.

Additionally, the apparatus 150 includes a Pulsed UV laser 170 (e.g., commercially available ArF, KrF, XeCl$_2$ or F$_2$ excimer lasers) for emitting a laser beam through the window 156 and to the wafer carefully positioned thereunder. Because of their high resolution capability, excimer lasers, operating in the range of about 145 nanometers to about 350 nanometers, are preferred. While an excimer laser is preferred, a continuous wave (CW) or solid state pulsed laser can also be used. The arrangement can be operated in a "projection" mode as illustrated, or in a scanned "direct write" mode which does not require an intermediate optical mask to direct the laser beam. In most instances, the Projection mode is preferred since it produces a partially coherent, non-gaussian beam characterized by reduced optical spreading and speckle noise. More specifically, in the illustrated arrangement, the laser beam emerging from the laser 170 passes through a mask element arrangement 172 preferably provided with an automatic mask loader/changer 173, a multi-element demagnifying lens arrangement 174 (e.g., Schwartzschild imaging system) preferably with automatic focusing, through the window 156 and to a selected region of the wafer. The selected region of the wafer is micropositioned under the beam by a stepper stage 176, for example, an X-Y table, which selectively moves the wafer as it is held by means of chuck 178. A controller 180 regulates the movement of the stepper stage 176 as well as the operation of the laser 170, and preferably provides for automatic alignment and overlay control.

The apparatus 150 can be used in a variety of different ways, including laser ablation, laser-assisted etching and solid state conversion, each of which can enable all dry patterning to be implemented.

Laser ablation and laser-assisted etching essentially involve the vaporization or erosion of resist material. It is used for positive, physical patterning of the resist. Suitable materials for laser ablation include, for example, AZ 1350J polymer photo-resist (Shipley Mfg. Co., Newton, Mass.), polyimides, PMMA, chromium, carbon, diamond, pyrex and alumina cermets.

In the case of AZ polymer, the resist material can be deposited onto the substrate by sputtering or the like, and then ablated/etched by laser irradiation, preferrably in a reactive atmosphere. For example, a polymer-coated wafer is placed in chamber 152, after purging and flushing the chamber 152, oxygen vapor is introduced via inlet conduit 158 to 100 Torr of pressure and a selected region of the wafer is then exposed to 20 ns-long pulses of 193 nm wavelength light from an ArF excimer laser at 170 mJ/cm$^2$ density.

Similarly, inorganic materials such as chromium can be deposited by electron beam evaporation or sputtering, and then laser-ablated or etched by laser irradiation in a reactive atmosphere. For example, a chromium-coated wafer can be introduced into chamber 102 of FIG. 3 and, after completion of chamber purging and flushing steps, the wafer is first exposed to 100 Torr HCl vapor and 20 Torr O2 vapor within the chamber 152. Then selected regions of the wafer are irradiated with 20 ns-long pulses of 193 nm wavelength light from an ArF excimer laser at a power density of approximately 300 mJ/cm$^2$. This results in etching of the chromium resist material so as to physically pattern the during the process, which is then pumped from the chamber 152 through outlet conduit 160.

A further example lies in laser-induced etching of tungsten resists in chlorine gas. Again, a tungsten resist can be deposited upon a wafer by sputtering, evaporation or other techniques as described above in connection with FIG. 2. The coated wafer can then be placed in the evacuated chamber 152, whereupon chlorine vapor is introduced to about 100 Torr pressure, and then the selected regions are irradiated at 40 mJ/cm$^2$ energy density with 193 nm-wavelength pulses of 20 ns duration from an ArF excimer laser in order to remove the resist in the exposed regions.

Solid state conversion is the conversion of solid film from erodible to non-erodible (for negative resists) or vice versa (for positive resists). An example of this technique is the latent patterning of amorphous silicon For this, amorphous silicon is electron beam evaporated to an approximate thickness of 0.2 microns. Exposure of the evaporated areas to 193 nm ArF laser pulses of 0.4 J/cm$^2$ energy density causes crystallization of the exposed film to form polysilicon.

Where direct physical patterning is achieved in the resist exposure module 14C, the patterning is complete and the wafer-in-process can be returned to the main bus 18 (FIG. 1).

Where only latent patterning is effected, the latent patterns must be then developed, i.e., the latent patterns must be converted or transformed into physical patterns. For positive resists, this is achieved in the resist developer module 14D by any of a variety of techniques, including further laser-induced etching, Reactive Ion Etching ("RIE"), Remote Plasma Etching ("RPE"), Magnatron Etching, Electron-Cyclotron-Resonance Etching, Plasma Etching, or Ion-Beam-Assisted Etching. For negative resists, the process typically involves chemical or thermal hardening of the exposed pattern regions, followed by etching of the unexposed regions as described above.

Figure 4:
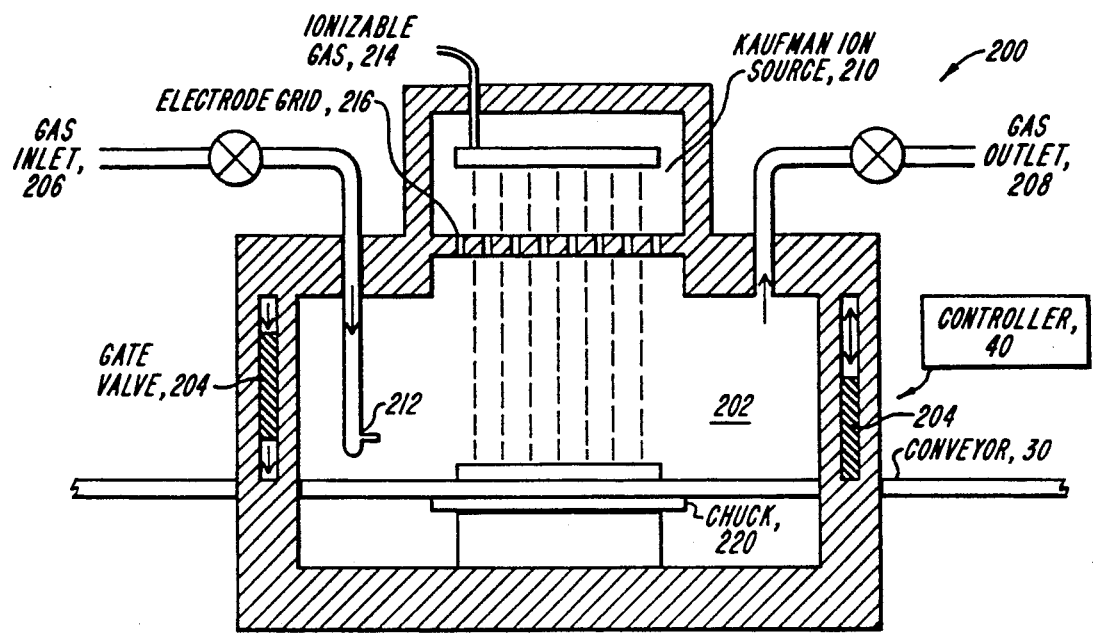
FIG. 4 is a schematic representation of one embodiment of the photo-lithographic resist developer module of FIG. 1.

FIG. 4 shows a representative embodiment of the resist developer module 14D employing an ion-beam-assisted etching technique. The illustrated apparatus 200 includes a vessel or chamber 202 similar to chamber 102, including smart gates 204, and valved gas inlet and outlet conduits 206, 208, water chuck 220, and a Kaufman ion source 210 positioned over the wafer. The Kaufman ion source produces a flood of moderately energized ions (on the order of about 0.3 to about 5 keV), such as Ar$^+$ ions, by passing an ionizable gas 214 through an electrically charged grid 216 and directing the resulting ions onto the coated wafer. At the same time Cl$_2$ vapor is introduced by jet nozzle 212 of inlet conduit 206. The ion beam excites chlorine atoms adsorbed on the surface of the resist and induced anisotropic etching of the previously exposed regions of the resist (in the case of positive resists) or the unexposed regions (in the case of negative resists). Such an arrangement finds particular utility with solid-transformation resists.

Alternatively, an RIE apparatus can be used to develop the resist. For example, the irradiated polymer resist film can be exposed to a hexamethyl disilane whereby silicon is reactively incorporated into the irradiated film at selected regions. Subsequently, the film is subjected to oxygen plasma. Since the silicon/polymer regions etch slower than the regions having no incorporated silicon, the patterns are developed.

After the resist has been patterned, it is typically necessary in many applications to transfer the pattern to the underlying substrate. This is achieved, for example, by etching the resist-covered wafer, such as by Reactive Ion Etching ("RIE"). Returning to the overview of FIG. 1, this can be accomplished by the controller 40 removing the wafer-in-process from module 14C or 14D, as appropriate, and returning it to main bus 18. The controller then routes the wafer to processing line 12B, as shown in FIG. 1. There, the wafer is queued up in another wafer queuing module 14E, similar to module 14A. Then, in its turn, the wafer is directed into an etching module 14F followed serially by the resist stripping module 14G.

Figure 5:
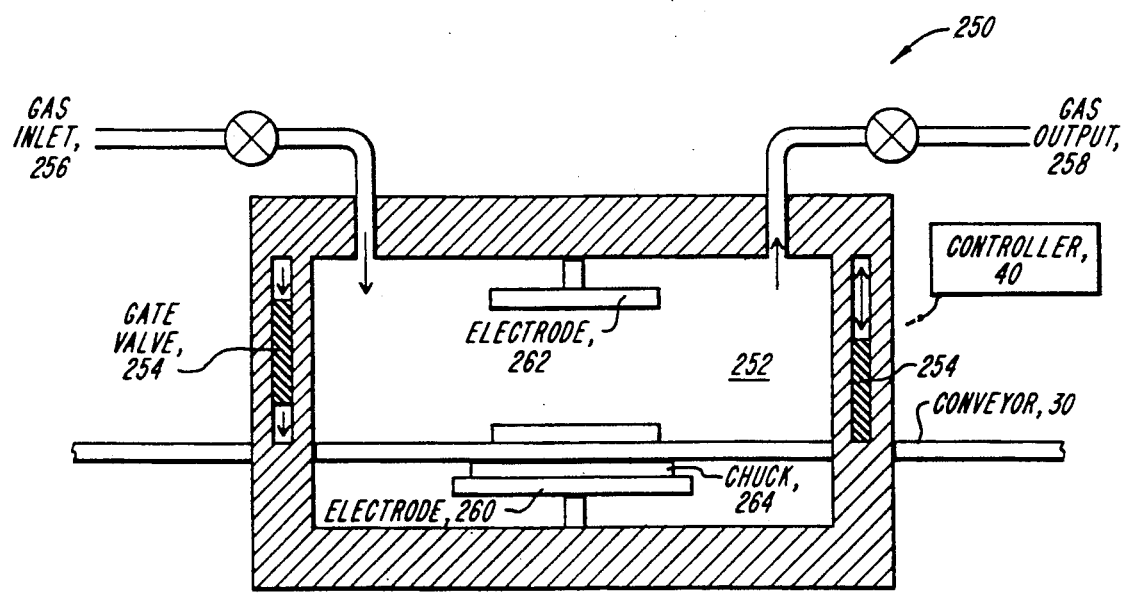
FIG. 5 is a schematic representation of one embodiment of the photo-lithographic-resist etching module of FIG. 1.

FIG. 5 is a representative embodiment of an etching module 14F showing a RIE apparatus 250. The RIE apparatus 250 includes a vessel or chamber 252 generally similar in many ways to chamber 102 described above, having smart gates 254, valved inlet and outlet gas conduits 256, 258, and wafer chuck 264. Additionally, RIE apparatus 250 has spaced, opposing (e.g., parallel plate) RF electrodes 260, 262.

A typical etching process using the illustrated RIE apparatus 250 entails several steps. First, as the wafer is introduced into the chamber 252 by transport 30, it is positioned on or electrically connected to the ground electrode 260. The chamber 252 is Purged/flushed of contaminating gases and then an etchant gas is introduced (e.g. CF$_4$ at approximately 0.1 Torr pressure). An RF discharge is induced between the electrodes 258, 260 causing etching by the etchant gas of exposed regions of the wafer.

The stripping module 14G of FIG. 1, although not specifically shown in detail, can employ a variety of techniques, including RIE techniques, to strip the remaining resist after the pattern has been transferred to the substrate. In many instances, a high energy plasma, such as an oxygen plasma, is most suitable for stripping.

Figure 6A:
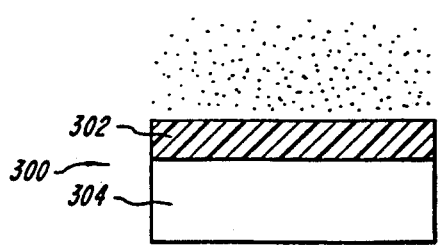
FIGS. 6A through 6E, inclusive, are schematic representations in cross-section of a wafer during various processing steps in accordance with the invention.
Figure 6B:
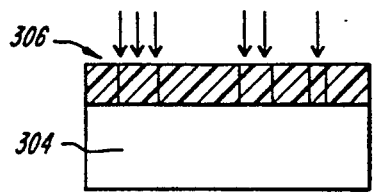
Figure 6C:
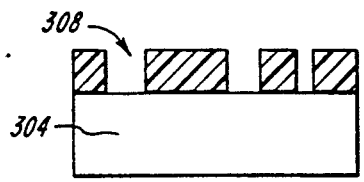
Figure 6D:
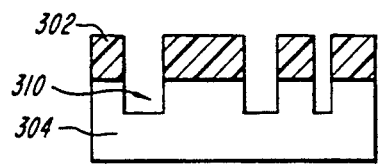
Figure 6E:

FIGS. 6A through 6E show a wafer 300 in cross-section at various steps during processing as described hereinabove. In FIG. 6A a resist film or layer 302 (e.g., a negative resist 0.10 microns thick) is deposited on a substrate 304 of, for example, Si or GaAS. In FIG. 6B latent patterns 306 are generated in the resist film 302 by exposure to a laser beam. FIG. 6C shows the wafer 300 with physical patterns 308 in the resist film 302. The Physical patterns 308 can be generated either by the resist film shown in FIG. 6A being self-developing and subjected to laser exposure (e.g., hard carbon resist, pulsed 193 nm radiation, projected image, $0.2/cm^2$, $O_2$, $O_2$ ambient), or by developing of the latent patterns 30B shown in FIG. 6B. FIG. 6D shows pattern transfer, i.e., the resist patterns 308, have been used as a contact mask to generate matching physical patterns 310 of selected depth in substrate 304 (e.g., by RIE). In FIG. 6E, the resist film 302 has been removed or stripped (e.g., by $O_2$ plasma), leaving a patterned wafer substrate ready for other processing.

Several examples of lithographic patterning shall now be given with reference to the above-identified process blocks.

EXAMPLE I—PMMA RESIST ON GaAs SUBSTRATE

The present invention can be practiced to selectively etch a GaAs wafer or other substrate by hot jet etching of exposed substrate regions after deposition and patterning of a PMMA resist. In this application, the substrate is first dry-coated with PMMA in a deposition chamber using, for example, a CVD technique such as described above, in which dimethyl cadium and methyl methacrylate are reacted under flood illumination to deposit PMMA on the GaAs substrate surface. The coated wafer is maintained in a controlled ambient, such as dry nitrogen or argon, as it is automatically transported from the deposition chamber to a resist patterning chamber, where it can be patterned, for example, by laser ablation or laser-assisted etching. The laser light, Preferrably from an excimer laser, used to image a mask reticle onto the PMMA-coated substrate. Ablation of the exposed regions or laser-assisted etching results in selective exposure of the underlying substrate. The patterned substrate is then transported, again automatically and, if desired, in a controlled ambient environment, to an etching chamber, where the exposed regions of the substrate can be selectively etched. For example, a hot jet of $Cl_2$ gas (in the case of GaAs) can be used to selectively etch the exposed regions while the remaining portions of the PMMA coating protect the other regions of the substrate from etching. In a further step after a suitable contour in the substrate is achieved, the sacrificial PMMA resist can be removed in the same or a further chamber, for example, by oxygen plasma etching.

EXAMPLE II—CHROMIUM RESIST OR SILICON SUBSTRATE

The invention can also be practiced to selectively etch a silicon wafer or other substrate by ion-beam-assisted etching of exposed substrate regions after deposition and patterning of a chromium resist. In this application the substrate is coated with chromium in a deposition chamber using, for example, an electron beam evaporation technique, in which electrons are used to heat and evaporate a chromium-containing target.

The resulting chromium vapor then condenses on the substrate. The coated substrate is maintained in a controlled ambient as it is automatically transported from the deposition chamber to a resist patterning laser-assisted etching, as described above, in the presence of oxygen and HCl vapor, employing a projection mask to selectively expose and thereby, remove portions of the chromium resist. The substrate is then transported, again in a controlled ambient environment, if desired, to an etching chamber, where the exposed regions are selectively etched. For example, reactive ion etching can be employed whereby an RF plasma is used to dissociate carbon tetrafluoride and release reactive fluorine ions. The reactive ions selectively etch the exposed regions of the substrate while the remaining portions of chromium coating protect the other regions of the substrate from etching. Again, after a suitable contour is achieved in the substrate, the remaining chromium resist can be removed in the same or a further chamber, for example, by ion-beam sputter-etching.

EXAMPLE III—GRAPHITE RESIST ON SILICON DIOXIDE

In another embodiment of the invention, a $SiO_2$ wafer or other substrate can be selectively etched by ion-beam assisted etching of exposed regions after deposition and patterning of a pyrolytic graphite resist. In this instance, the substrate is coated with pyrolytic graphite in a deposition chamber using, for example, a CVD technique in which toulene is exposed to flood illumination to deposit a pyrolytic carbon coating on a heated substrate. The coated substrate is maintained in a controlled ambient as it is transported to a resist patterning chamber, where it is patterned, for example, by excimer laser ablation in an oxygen atmosphere in a manner analogous to the patterning procedures discussed above. The patterned substrate is then transported to an etching chamber, where exposed regions are selectively etched. For example, ion-beam-assisted etching can be employed whereby the patterned substrate is treated with an etchant, such as xenon flouride, and exposed to a Kaufman ion source (as described in connection with FIG. 4) to induce anisotropic etching of the exposed $SiO_2$ regions. After a suitable contour is achieved in the substrate, the remaining graphite resist can be removed, for example, by oxygen plasma etching.

EXAMPLE IV—AMORPHOUS SILICON RESIST ON ALUMINUM

In yet another embodiment of the invention, an aluminum layer or substrate can be selectively etched by reactive ion etching of exposed aluminum regions after deposition and patterning of an amorphous silicon resist. In this instance, the aluminum substrate is coated with amorphous silicon in a deposition chamber, for example, using an RF plasma to decompose a silane or disilane gas. The coated substrate is then transported automatically and in a controlled atmosphere from the deposition chamber to a resist patterning chamber, where a latent pattern can be formed in the silicon resist, for example, by excimer laser exposure through a projection mask or direct writing. (For 193 nm wavelength laser irradiation, a peak pulse energy intensity on the order of 250 mJ/cm$^2$ can be employed.) The substrate is then transported, again if desired, in a controlled ambient, to a development chamber where the laser-exposed regions of the latent pattern are removed by development, for example, in a carbon tetrafluoride plasma. The substrate is then transported to an etching chamber where the exposed aluminum regions are etched, for example, by reactive ion etching, as described previously, using boron trichloride or the like as an etchant. Finally, the stripping chamber employing a chlorine plasma.

Selected properties of exemplary self-developing excimer resists, together with laser exposure parameter, are provided below in Table 1:

processing during micro-fabrication, and after the wafer-in-process has been returned to a controlled atmosphere, the passivating layer is removed, e.g., by heating or reactive etching. Such an approach can be used, for example, between processing steps performed by process lines 12A and 12B of the I.C. micro-fabricating machine 10 shown in FIG. 1. In fact, with this approach, the processing lines 12A and 12B can be located in separate enclosures.

The invention can be embodied in other specific forms without departing from the spirit or essential characteristics thereof. The described embodiments of the invention are to be considered in all respects as illustrative and not restrictive, the scope of the invention being indicated by the appended claims rather than the foregoing description, and all changes which come within the meaning and range of equivalency of the claims are therefore intended to be embraced therein.

I claim:

1. An automated, dry, process for forming a pattern

TABLE 1

| | LASER WAVELENGTH (nm) | DOSE/PULSE (mj/cm$^2$) | RATE (nm/Pulse) | RESOLUTION $\mu$m |
|---|---|---|---|---|
| 1. ORGANICS | | | | |
| POLYIMIDE | 193 | 18-1000 | 20-300 | 0.9-2 |
| AZ 1350 J RESIST | 193 | 80 | 140 | 0.4 |
| PMMA | 193 | 1200 | 150 | 0.3 |
| 2. INORGANICS | | | | |
| PYREX | 193 | 500 | 150 | 0.4 |
| Al/O CERMET | 193 | 30 | 30 | <1 |
| DIAMOND | 193 | 65000 | 140 | 0.13 |
| DIAMOND-LIKE CARBON RESIST | 193 | 130 | 200 | 0.13 |

Figure 7:
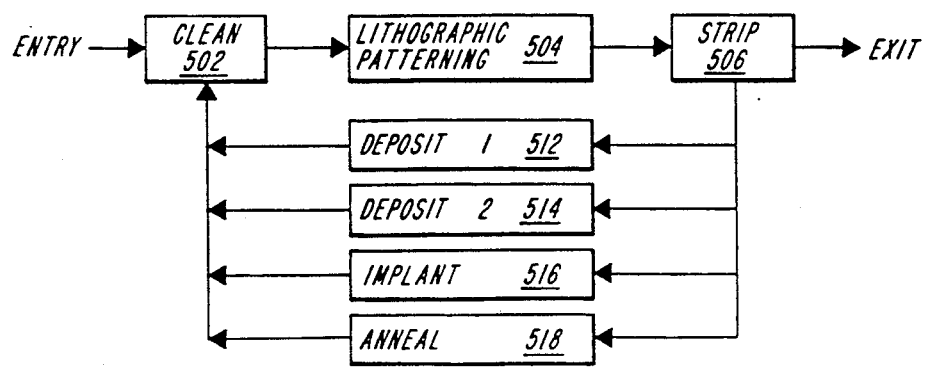
FIG. 7 is a diagrammatic representation of a process flow configuration for micro-fabrication of a wafer in accordance with the invention.

FIG. 7 furthers shows schematically an overall process configuration 500 for micro-fabrication of an integrated circuit wafer according to the present invention. A wafer to be processed enters on the left at the block labeled "entry" is cleaned at block 502 and subjected to lithographic patterning at block 504. Then the remaining resist is removed or stripped at block 506. Preferably, all of the foregoing occurs within a single enclosure, or, at least, without subjecting the wafer to exposure to air or liquid solutions or solvents. After stripping, the wafer can be removed as indicated by "exit" located at the right side of FIG. 7. Alternatively, and as required for the micro-fabrication or as permitted by the particular level of system automation utilized, the wafer can be further processed by deposition of other films or layers (e.g., metal) at blocks 512 or 514 labeled Deposit #1 and Deposit #2, or implantation of dopant at implant block 516, subjected to baking at anneal block 518, or to any other wafer processing step well known to one skilled in the art. After completion of any of these, the wafer is returned to the cleaning block 502, for further cycling through the system. Preferably, even the additional processing steps are performed within the single enclosure or, at least, without adverse exposure to harmful agents.

If a single enclosure for all of the aforedescribed processing steps is undesirable for any particular application, a wafer-in-process can have its delicate surface topography protected against chemical attack by exposure to air or other oxidizing or harmful agents by passivating or stabilizing and sealing the surface. This can be achieved, for example, by an evaporated silicon monoxide layer disposed on the surface. Prior to further on a surface of a substrate, the process comprising:
  dry deposition a continuous layer of a resist material comprising a metal by vapor deposition, on the surface of the substrate to form a metal coated substrate, wherein said metal is chosen from the set of aluminum, chromium, and tungsten,
  generating a pattern in the resist material by projecting radiation from an excimer laser through a mask to expose selectively the resist material to pulsed UV laser radiation, in the presence of a photoreactive etchant, and thereby to etch exposed portions of the resist,
  maintaining a controlled ambient environment of the resist material, by steps including maintaining the coated substrate in an inert gas environment, to avoid oxidation and exposure to contaminants between said resist depositing and pattern generating steps, and
  transferring the pattern from the resist material to the substrate.

2. An automated, dry, process for forming a pattern on a surface of a substrate, the process comprising:
  dry depositing a continuous layer of a graphite resist material by vapor deposition on the surface of the substrate to form a coated substrate,
  generating a pattern in the resist material by projecting radiation from an excimer laser through a mask to expose selectively the resist material to pulsed UV laser radiation in the presence of an oxygen containing gas and thereby ablate exposed portions of the resist, maintaining a controlled ambient environment of the resist material, by steps including maintaining the coated substrate in an inert gas environment, to avoid oxidation and exposure to contaminants between said resist depositing and pattern generating steps, and transferring the pattern from the resist material to the substrate.

3. An automated, dry, process for forming a pattern on a surface of a substrate, the process comprising:

dry depositing a continuous layer of an amorphous silicon resist material by vapor deposition on the surface of the substrate to form a coated substrate, generating a pattern in the resist material by projecting radiation from an excimer laser through a mask to expose selectively the resist material to pulsed UV laser radiation and thereby to transform portions of the resist into a material having an increased resistance to etchants, maintaining a controlled ambient environment of the resist material, by steps including maintaining the coated substrate in an inert gas environment, to avoid oxidation and exposure to contaminants between said resist depositing and pattern generating steps, and transferring the pattern from the resist material to the substrate.

* * * * *